(12) United States Patent
Pelletier et al.

(10) Patent No.: US 6,727,656 B1
(45) Date of Patent: Apr. 27, 2004

(54) POWER SPLITTER FOR PLASMA DEVICE

(75) Inventors: Jacques Pelletier, Saint Martin d'Hères (FR); Ana Lacoste, Saint Martin le Vinoux (FR); Thierry Léon Lagarde, Grenoble (FR); Michel Moisan, Montréal (CA); Yves Alban-Marie Arnal, Poisat (FR); Zenon Zakrzewski, Gdansk (PL)

(73) Assignees: Centre National de la Recherche Scientifique (CNRS), Paris (FR); Universite de Montreal, Montreal (CA); Metal Process, Montevrain (FR)

( * ) Notice: Subject to any disclaimer, the term of this patent is extended or adjusted under 35 U.S.C. 154(b) by 0 days.

(21) Appl. No.: 10/088,326

(22) PCT Filed: Sep. 12, 2000

(86) PCT No.: PCT/FR00/02507

§ 371 (c)(1),
(2), (4) Date: Jun. 18, 2002

(87) PCT Pub. No.: WO01/20710

PCT Pub. Date: Mar. 22, 2001

(51) Int. Cl.[7] .............................. H01J 7/24; H01Q 1/50
(52) U.S. Cl. .................................. 315/111.21; 343/852
(58) Field of Search ...................... 315/111.21, 111.41, 315/111.71, 111.81; 118/723 MW, 723 MR, 723 MA, 723 AN; 219/121.43, 690, 691, 693, 695, 696, 97; 343/850, 852, 860

(56) References Cited

U.S. PATENT DOCUMENTS

| | | | | |
|---|---|---|---|---|
| 4,847,460 A | | 7/1989 | Kieser et al. | |
| 5,153,406 A | * | 10/1992 | Smith | 219/121.43 |
| 5,517,085 A | | 5/1996 | Engemann et al. | |
| 5,714,009 A | * | 2/1998 | Boling | 118/723 MW |
| 5,796,080 A | * | 8/1998 | Jennings et al. | 219/697 |
| 5,869,817 A | * | 2/1999 | Zietlow et al. | 219/696 |
| 6,084,226 A | * | 7/2000 | Greene et al. | 219/718 |
| 6,158,383 A | * | 12/2000 | Watanabe et al. | 118/723 AN |
| 6,258,329 B1 | * | 7/2001 | Mutterer et al. | 422/186.29 |

FOREIGN PATENT DOCUMENTS

EP       04041675       5/1992

* cited by examiner

Primary Examiner—James Clinger
Assistant Examiner—Minh D A
(74) Attorney, Agent, or Firm—Blakely, Sokoloff, Taylor & Zafman

(57) ABSTRACT

The invention concerns a system including a microwave generator and a rectangular guide connected with the generator. The system is adapted to operate in fundamental ($H_{10}$) or transverse electrical ($TE_{10}$) mode, and associated with means providing a standing wave pattern. The system also includes many power connectors arranged in the guide at zones of maximum amplitude for one of the components of the electromagnetic field for splitting the generator power. The power connectors are adjusted so that the sum of their reduced admittance levels brought to the splitter input formed by the guide is in a single unit and many sources, respectively connected to a connector of the guide, via insulating means ensuring a power transmission of the connector to the source without reflecting towards the connector and a device adapting impedance of each source, located downstream of the insulating means, between the latter and associated source.

16 Claims, 4 Drawing Sheets

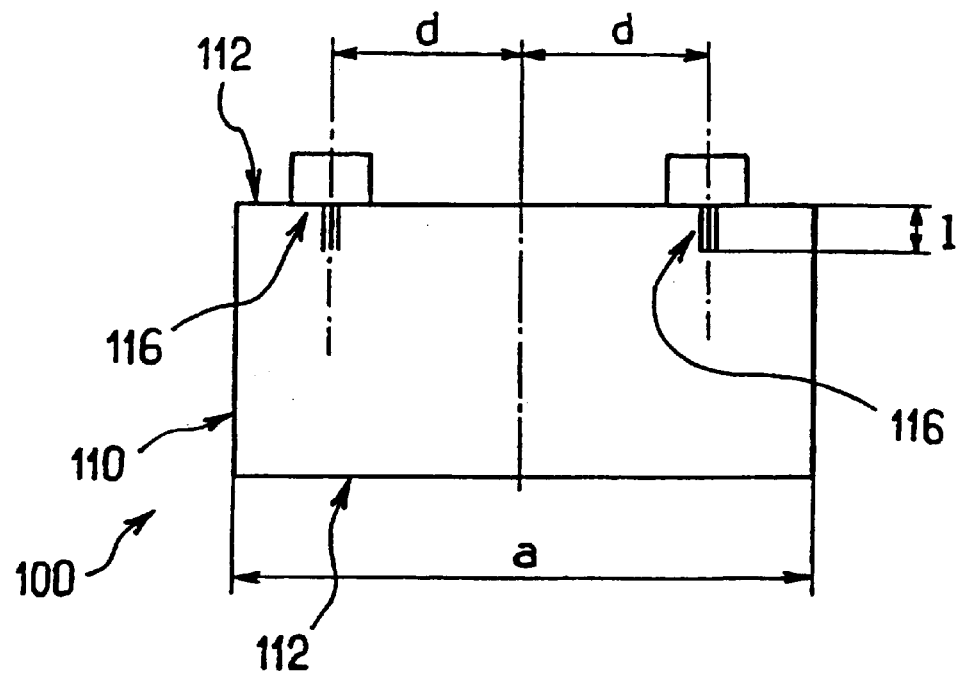
FIG_2
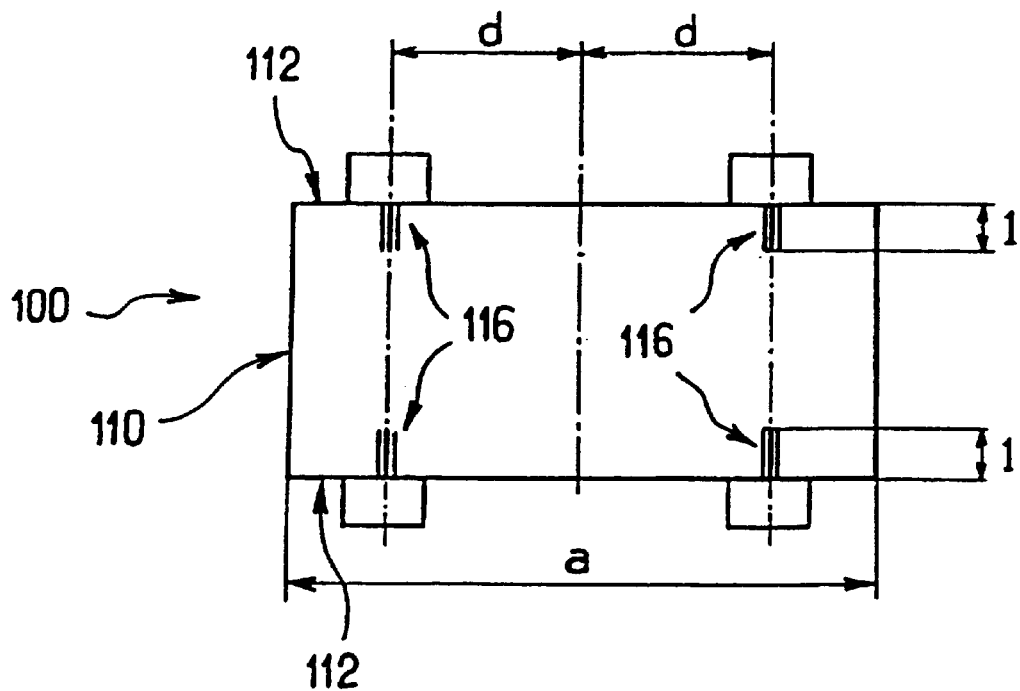
FIG_3

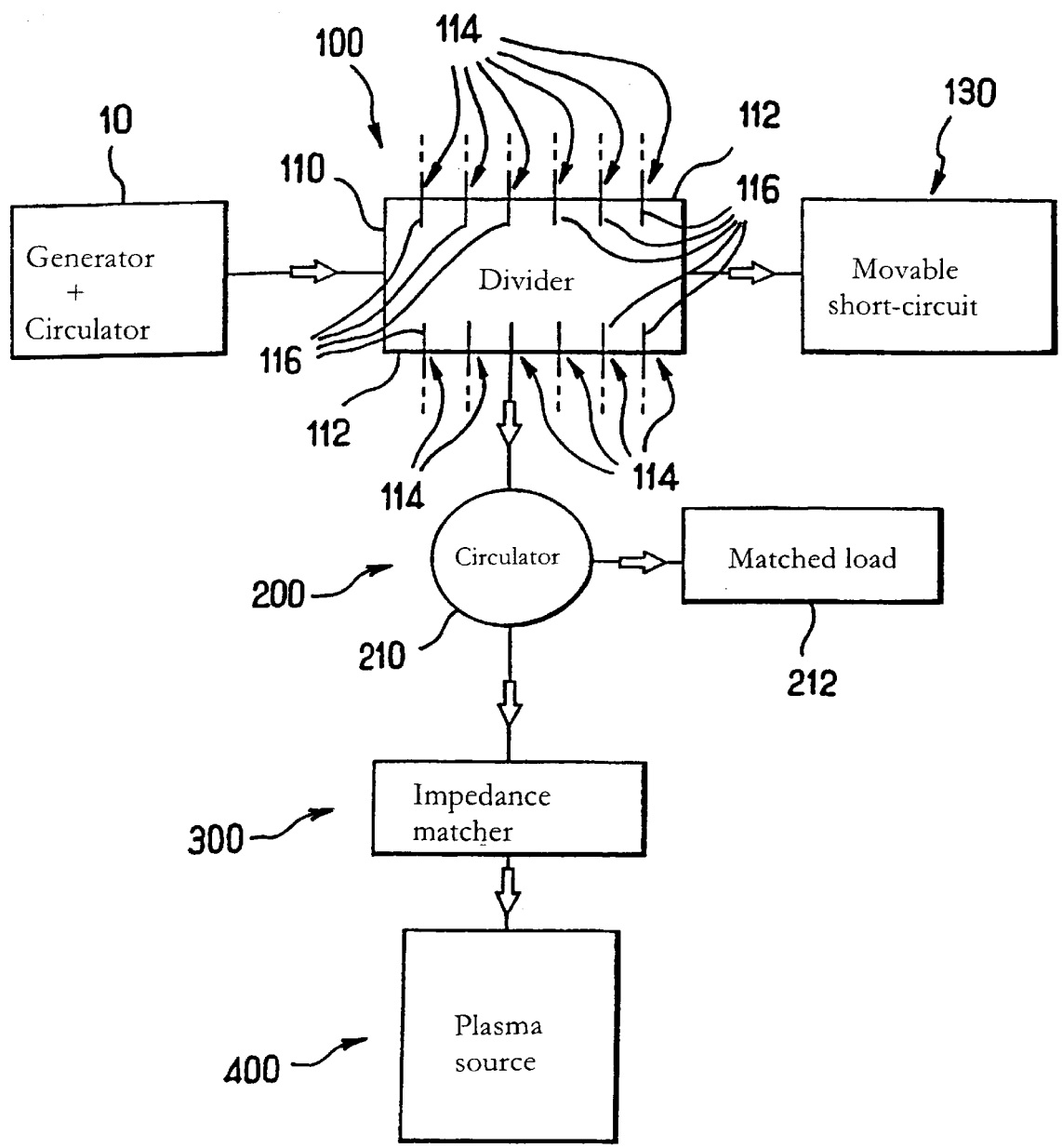
FIG_4

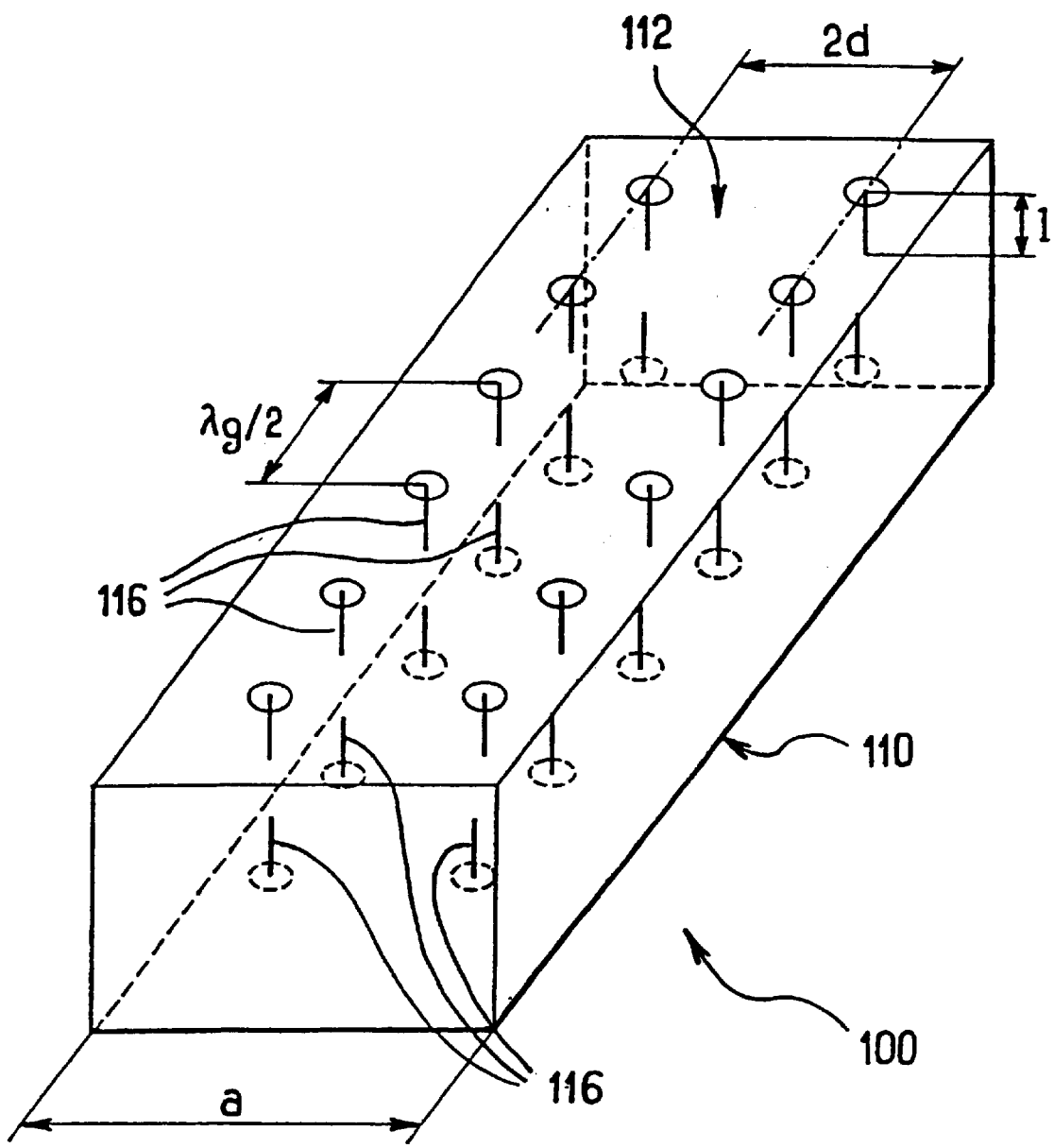
FIG_5

POWER SPLITTER FOR PLASMA DEVICE

BACKGROUND

1. Field

The present invention relates to the field of microwave devices.

More specifically, the present invention relates to the field of devices comprising several individual microwave sources supplied from a common generator.

2. Description of Related Art

The present invention may especially find applications in the production of a plasma from a given number of individual plasma sources supplied with microwave power from a single power generator.

These individual sources may either be independent in the same chamber (the objective being, for example, to overcome the physical or technological limits on the maximum microwave power that it is possible to apply to a single plasma source) or be distributed in the same chamber so as to allow the extension of scale needed for an intended application. In general, the fields of application of multiple plasma sources may cover not only all the fields already covered by the use of single plasma sources, but also novel fields that cannot be envisioned with unitary sources (for example for reasons of uniformity, rates, etc.).

The invention relates to all microwave plasmas and discharges, whatever the pressure range, the microwave frequency, the nature or the configuration of the microwave applicator and the presence or absence of a magnetic field.

However, the invention is not limited to the field of plasmas. It may, for example, also be applied for bonding, drying or curing operations using multiple stations and more generally for any operation in which the impedance of the system may vary over time from one station to another.

The microwave field has already been the subject of extensive research.

Several proposals have already been made to supply several individual sources from a common generator.

To divide the microwave power delivered by a single generator, it is possible to use cascades of 3 dB couplers (division by 2) which are formed, for example, from rectangular waveguides. This solution, although often requiring a very large amount of space, makes it possible to produce power divisions by $N=2^k$, where k represents the number of successive levels of the cascade. Thus, the microwave power may be divided by 2, 4, 8, 16, 32, etc. A matched coax/waveguide transition at the end of each waveguide furthermore allows the microwave power to be transported by means of coaxial cables fitted with standard connectors.

Another widely used solution is to take off microwave power either into a cavity, or into a waveguide, or into a ring resonator, in which cavity, waveguide or ring resonator standing waves are created, by antennas placed at the electric field antinodes (regions of maximum electric field. This solution assumes in general that each individual plasma source behaves as a matched impedance, in other words that it absorbs all of the microwave power taken off. With such a device, it is then possible to deliver a predetermined microwave power to each individual source.

However, the devices proposed hitherto are not completely satisfactory.

One of the difficulties of dividing microwave power for the purpose of supplying plasma sources is that, as a general rule, a plasma source does not behave as a matched load. This is because the impedance taken back to the input of a plasma source, resulting from the combination of the input impedance of the applicator and of the impedance of the plasma taken back to this input, does not generally correspond to a matched load, that is to say a purely resistive load equal to the characteristic impedance of the microwave supply line. On the contrary, one may be faced, depending of the type of discharge, the discharge conditions and the absorbed power, with complex impedance values at the input of the plasma source, values which vary from zero to infinity.

In the case of several plasma sources fed by the same microwave generator, there is also the problem of the influence of the impedance of a source on all of the other sources in the absence of sufficient decoupling (typically>20 dB) between the supply lines for the various microwave sources.

Thus, immediately after ignition, the input impedance of the source is generally much higher than that corresponding when the discharge is in the steady state. Apart from this variation in impedance for a given source at the moment of ignition, the power distribution is also affected by the various plasma sources not being ignited simultaneously. Consequently, when turning on a number of plasma sources one is necessarily confronted with significant imbalances in the power transmitted to the plasma sources and with the introduction of considerable reflected power into the circuit.

These imbalances, which cause very high reflected power levels, may prevent the plasma from being turned on in the sources requiring a minimum plasma density, and hence a minimum transmitted power, such as for example in surface wave plasmas.

Another difficulty involving impedance imbalance arises in the case of plasmas whose plasma density is, on the contrary, limited to an upper value, for example the critical density, as in plasmas using distributed electron cyclotron resonance. In this case, the entire incident power greater than the value ensuring the critical density is reflected at the input of the source and sent back into the microwave distribution circuit.

Furthermore, impedance imbalances may also be encountered during operation, for example should one of the sources fail, or after an intentional or unintentional variation in the operating conditions (composition of the gas, flow rate, pressure, density of the plasma, radio frequency bias, etc.) during multisequence processes.

Finally, in the case of several plasma sources operating in the same chamber, the interference between applicators also results in reflected power levels which may disturb the desired power distribution.

Thus, the conventional solutions for microwave power division are either excessively bulky (cascades of 3 dB couplers) or allow only division by prescribed numbers $n=2^k$, or require a matched impedance, which is not the case with a plasma source.

SUMMARY

The objective of the present invention is to improve the microwave systems comprising several individual sources fed from a common generator, so as to eliminate the drawbacks of the prior art.

This objective is achieved within the context of the present invention by means of a system comprising:

- a microwave generator;
- a rectangular waveguide coupled to the generator, matched in order to operate in the fundamental mode ($H_{10}$) or in the transverse electric mode ($TE_{10}$), and combined with means ensuring standing wave conditions;

a plurality of power output ports placed in the waveguide in the regions of maximum amplitude of one of the components of the electromagnetic field in order to provide power division for the generator, the power output ports being adjusted in such a way that the sum of their reduced admittances brought back to the input of the divider formed by the rectangular waveguide is unitary and a plurality of sources which are coupled respectively to an output port by the agency of an isolator means ensuring power transmission from the output port to the source, without being reflected back to the output port, and of a device for matching the impedance of each source, said device being located downstream of the isolator means, between the latter and the associated source.

BRIEF DESCRIPTION OF THE SEVERAL VIEWS OF THE DRAWINGS

Further features, objectives and advantages of the present invention will become apparent on reading the detailed description which follows and in conjunction with the appended drawings given by way of nonlimiting examples, in which.

FIGS. 2 and 3 show cross-sectional views of a waveguide and illustrate two alternative forms of output ports or antennas on the latter;

FIG. 4 shows an overall schematic view of a device according to the present invention;

FIG. 5 shows a perspective view of a guide corresponding to a preferred embodiment of the present invention.

DETAILED DESCRIPTION

Figure 1:
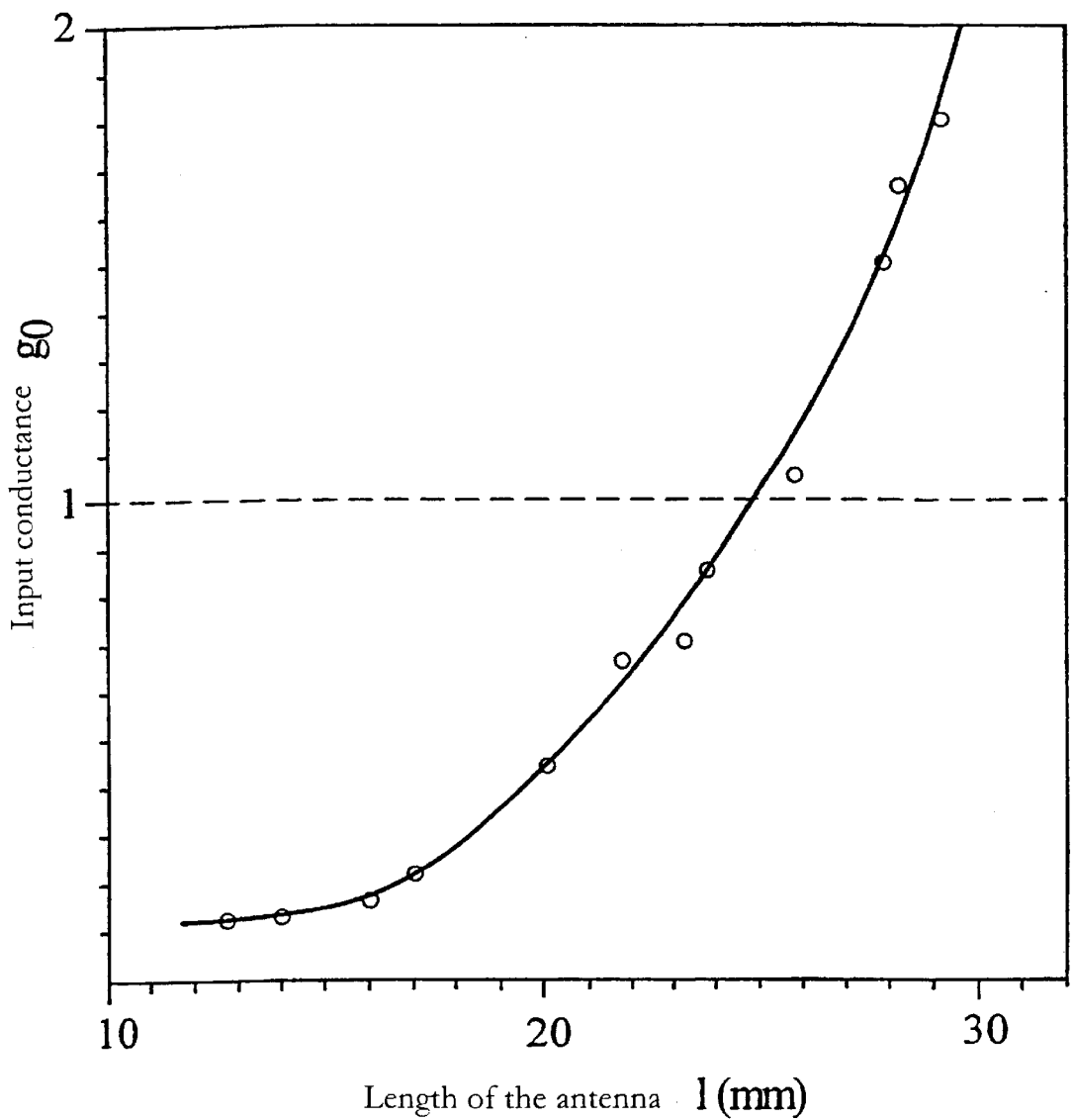
FIG. 1 shows the change in the reduced conductance of an antenna, brought back to the input of the waveguide, as a function of the length of this antenna in the waveguide.

As indicated above, the present invention makes use of the combination of three elements, the first, 100, of which ensures the required power division (preferably, but not necessarily, equidistribution according to the requirements), the second, 200, ensures independent power transmission, with no reflection, at each source 400, whatever the input impedance presented by each of these sources 400, and a third, 300, an impedance matching device on each source 400 ensures that the power thus available is more or less completely absorbed (for example in the plasma) according to the requirements.

More precisely within the context of the invention, the power divider 100 is obtained from a rectangular waveguide 110 from which power is tapped off, generally in the long side 112 of the waveguide, at points 114 separated by one half of the wavelength in the waveguide, i.e. $\lambda_g/2$.

This wavelength $\lambda_g$ satisfies the equation:

$$1/\lambda_g^2 = 1/\lambda_0^2 - 1/(2a)^2 \qquad (1)$$

where a is the width of the long side 112 of the rectangular waveguide 110 and $\lambda_0$ is the wavelength in vacuo of the microwaves.

To provide the required power division, it is possible, for example, to create a standing wave of constant amplitude by means of a reflecting plane 130 (a fixed or movable short-circuit) located as that end of the waveguide 110 on the opposite side from the microwave power feed coming from the generator 10. Meeting this constant-amplitude standing wave condition means that the waveguide 110 allows the propagation of only a single mode.

Thus, within the context of the present invention, the waveguide 110 is designed to operate in the fundamental mode $H_{10}$ or the transverse electric mode $TE_{10}$.

In the case of a power take-off by means of an electrical antenna, it is advisable for the antennas 116 to be preferably placed at the maximum of the electric field intensity.

In the case of a take-off by means of a magnetic antenna 116 (a loop), it is necessary on the contrary, to place these antennas 116 at the electric field intensity minimum (magnetic field maximum).

To ensure that the total impedance presented at the input of the power division device 100 is equal to the characteristic impedance of the waveguide 110 (unitary reduced impedance), it is necessary for the sum of the reduced admittances (in the case of electric coupling) of all of the antennas 116, brought back to the input of the divider 100, to be unitary. To achieve this result, it is necessary either to adjust the depth of penetration of the electrical antenna 116 into the waveguide 110 or to displace the position of the antennas 116 transversely with respect to the axis of the waveguide 110, or else to combine these two options. The magnetic coupling case may be treated in an equivalent manner.

As an example, in the case of the microwave power split equally N ways using electrical coupling, the reduced conductance (real part of the impedance) (with respect to the characteristic impedance) of an antenna 116, taken back to the input of the waveguide, is given by the expression:

$$g = 1/N \qquad (2)$$

For a given shape and a given diameter, the length of the antenna 116 must therefore be adjusted so as to obtain the impedance corresponding to the desired N-way power division.

An example of the change in conductance as a function of the length of the antenna 116 is shown in FIG. 1 (for an antenna 3 mm in diameter with, at the end, a head 5 mm in diameter and 2 mm in thickness) for antennas placed along the axis of one of the long sides 112 of the waveguide 110.

In order to reduce the length of the device 100 which, in the configuration described above is equal to $N\lambda_g/2$, an alternative form of the invention consists in placing two antennas 116 on either side of the axis of the long side 112 of the waveguide 110 every $\lambda_g/2$, as in the first configuration presented. If $g_0$ is the conductance of an antenna 116 on the axis, its value g at a distance d from the axis of the long side 112 of the waveguide 110 is given by:

$$g = g_0 \cos^2(\pi d/a) \qquad (3)$$

In order to reduce the length of the device 100 further, another complementary alternative form of the invention consists in placing pairs of antennas 116, as in the previous configuration, opposite one another, each pair on the two faces of the long sides 112 of the waveguide 110, as shown schematically in FIG. 3. However, this option is limited, in terms of the achievable conductance, by the fact that the facing antennas 116 must neither touch each other, nor be too close to each other: the interaction between facing antennas 116 results in an increase in the conductance of each antenna 116.

Apart from the configuration presented above, based on a rectangular waveguide 110 with a reflecting plane 130, it is possible to insert just part of the rectangular waveguide 110 with its antennas 116 into a ring resonator. In this case, it is advisable to arrange for the resonator to operate in standing-wave mode (and not in traveling-wave mode) and to ensure by means of phase shifters that the position of the electric field maxima of the microwaves in the ring corresponds to the position of the electrical coupling antennas 116.

Another alternative form of the invention consists in taking the power off the waveguide via slots, especially within the context of application to the transmission of power to the plasma sources 400 via waveguides.

The second element 200 of the invention is intended to ensure independent power transmission, without any reflection, to each source 400. This is achieved by inserting a unidirectional isolator 200 between the output of the antenna 116 of the divider waveguide 110 and the applicator. Said isolator generally consists of a three-branch circulator 210 based on ferrites and terminated, on its third branch, by a matched load 212 intended to absorb all the reflected power coming from the plasma source 400. To operate this device properly requires an interbranch isolation generally greater than 20 dB.

The third element 300 of the invention is intended to allow impedance matching to each source 400, so as to ensure that the power thus available is more or less completely absorbed in the plasma according to the requirements. This may be achieved by making use of conventional impedance matching devices, such as a trombone line, or a system having three plungers. An essential characteristic required of these various possible devices is to be able to act both on the imaginary part and the real part of the impedance. This allows the impedance of the source 400 to be adjusted according to the desired plasma conditions (density, length, etc.)

A complete typical power division device according to the invention is shown schematically in FIG. 4. After the microwave generator 10 (and optionally its protective circulator), this comprises, in succession, the power divider 100 with its movable short-circuit 130 and the transmission lines to each plasma source 400. Each transmission line comprises a circulator 210 and its matched load 212 (which absorbs the reflected power), together with the impedance matching device 300 just upstream of the plasma source 400.

The main advantage of the device according to the invention is that it allows a large number of plasma sources 400 to be supplied from a single generator 10. Moreover, this device is produced from simple elements, several of which are commercially available at the present time.

A device of the invention may be used with any type of microwave applicator.

An essential advantage of the invention presented is the possibility of distributing the microwave power over any number N of antennas 116, it even being possible for N to be an odd number. The invention also allows one or more plasma lines to be removed without impairing the operation of the others.

The invention, which prevents any interference between the supplies for the various plasma sources 400, makes it possible to achieve rapid impedance matching to each of the plasma sources 400.

Finally, the invention allows particularly compact devices to be produced.

One particular, but nonlimiting, application example illustrating the invention comprises a device for dividing the power by 24 (shown schematically in FIG. 5), using the WR 340 rectangular waveguide standard in which the long side 112 of the waveguide 110 has a width a=86 mm (width of the short side of the waveguide b=43 mm). At a frequency of 2.45 GHz, the wavelength in vacuo is $\lambda_0$=122.45 mm and the wavelength in the waveguide (Eq. 1) is:

$$\lambda_g=174.4 \text{ mm} \qquad (4)$$

As a consequence, the antennas 116 or groups of antennas are positioned along the waveguide 110 every $\lambda_g/2$, i.e. every 87.2 mm.

The reduced conductance g of the antenna 116 (Eq. 2) for division by N=24 requires:

$$G=0.0417 \qquad (5)$$

The corresponding conductance $g_0$ of an antenna 116 of the same length l placed on the axis of a long side of the waveguide (d=0), given by Equation (3), for a distance from the axis of the long side of the waveguide d=26 mm, is:

$$g_0=0.123 \qquad (6)$$

The reduced impedance go of an antenna 116 of length l, determined experimentally, is given from FIG. 1. The antenna length l corresponding to the impedance value given by Equation (6) is approximately (FIG. 1):

$$l \; 12.75 \text{ mm} \qquad (7)$$

As a consequence, the power divider 100 divided by 24 thus produced, as shown schematically in FIG. 5 is relatively compact since its total length corresponds to 5 half-wavelengths (plus the space required for the antenna output ports and their coaxial connectors).

Of course, each of the 24 transmission lines coming from the divider 100 comprises, in succession, an isolator 200 with its matched load 212 and the impedance matching 300 just upstream of the plasma source 400.

Outside plasmas, the device according to the invention can be applied in any process where impedance variations may arise on one or other of the N applicators supplied independently by the microwave power divider.

Of course, the present invention is not limited to the particular embodiments which have just been described, rather it extends to any variant in accordance with its spirit.

Thus, as a variant, it is possible to provide an arrangement of antennas which is not symmetrical with respect to the axis of the long side of the waveguide.

What is claimed is:

1. A microwave system comprising:
   a microwave generator (10);
   a rectangular waveguide (110) coupled to the generator (10), matched in order to operate in the fundamental mode (H10) or in the transverse electric mode (TE10), and combined with means ensuring standing wave conditions;
   a plurality of power output ports (116) placed in the waveguide (110) in the regions of maximum amplitude of one of the components of the electromagnetic field in order to provide power division for the generator (10), the power output ports (116) being adjusted in such a way that the sum of their reduced admittances brought back to the input of the divider formed by the rectangular waveguide (110) is unitary
   a plurality of implements in form of sources (400) operating with a supplied microwave power, which are coupled respectively to an output port (116) of the waveguide (110)
   a plurality of isolator means (200) provided respectively between an output port and an implement for ensuring power transmission from the output port (116) to the implement (400), without being reflected back to the output port (116), and a plurality of devices (300) respectively associated with each implement for matching the impedance of each implement (400), each device being located downstream of an isolator means (200), between the latter and an associated implement (400).

2. The system as claimed in claim 1, characterized in that at least one of the implements (400) is a plasma source.

3. The system as claimed in claim 1, characterized in that the waveguide (110) includes a reflecting plane (130) forming a fixed or movable short-circuit in order to fulfill a standing wave condition.

4. The system as claimed in claim 1, characterized in that the rectangular waveguide (110) with its output ports (116) is placed in a ring resonator.

5. The system as claimed in claim 1, characterized in that the power output ports are formed from electrical antennas located at the maximum of the electric field intensity.

6. The system as claimed in claim 1, characterized in that the power output ports (116) are formed from magnetic antennas located at the electric field intensity minimum.

7. The system as claimed in claim 1, characterized in that the power output ports (116) are formed by slots.

8. The system as claimed in claim 1, characterized in that the power output ports (116) are located on a long side (112) of the waveguide (110).

9. The system as claimed in claim 1, characterized in that the power output ports (116) are separated by half of the wavelength ($\lambda_g/2$) in the waveguide (110).

10. The system as claimed in claim 1, characterized in that it includes at least one pair of antennas (116) placed respectively on either side of the axis of the long side (112) of the waveguide (110).

11. The system as claimed in claim 1, characterized in that it includes at least one pair of antennas (116) which are placed respectively on either side of the axis of the long side (112) of the waveguide (110) in a symmetrical manner.

12. The system as claimed in claim 1, characterized in that it includes at least one pair of antennas (116) which are placed respectively on either side of the axis of a long side (112) of the waveguide (110), respectively on each of the long sides (112) of the waveguide.

13. The system as claimed in claim 1, characterized in that it includes at least one pair of antennas (116) which are placed in a symmetric manner respectively on either side of the axis of a long side (112) of the waveguide (110), respectively on each of the long sides (112) of the waveguide.

14. The system as claimed in claim 1, characterized in that the isolator means (200) consists of a three-branch circulator (210), which is combined with a matched load (212) on one of the branches.

15. The system as claimed in claim 1, characterized in that the impedance matching device (300) is chosen from the group comprising a trombone line or a system having three plungers.

16. The system as claimed in claim 1, characterized in that, for the microwave power to be split equally N ways, N antennas (116) of identical reduced conductance are provided, each conductance, taken back to the input of the waveguide, being equal to g=1/N.

* * * * *

UNITED STATES PATENT AND TRADEMARK OFFICE
CERTIFICATE OF CORRECTION

PATENT NO. : 6,727,656 B1
DATED : April 27, 2004
INVENTOR(S) : Pelletier et al.

Page 1 of 1

It is certified that error appears in the above-identified patent and that said Letters Patent is hereby corrected as shown below:

<u>Title page,</u>
Item [30], Foreign Application Priority Data, please insert
-- September 13, 1999   France .......... 9911422 --.

Signed and Sealed this

Twenty-ninth Day of November, 2005

JON W. DUDAS
*Director of the United States Patent and Trademark Office*